United States Patent
Zypman et al.

(10) Patent No.: US 6,452,170 B1
(45) Date of Patent: Sep. 17, 2002

(54) SCANNING FORCE MICROSCOPE TO DETERMINE INTERACTION FORCES WITH HIGH-FREQUENCY CANTILEVER

(75) Inventors: Fredy R. Zypman, Humacao, PR (US); Steve Eppell, Cleveland Heights, OH (US)

(73) Assignees: University of Puerto Rico, San Juan, PR (US); Case Western Reserve University, Cleveland, OH (US)

( * ) Notice: Subject to any disclaimer, the term of this patent is extended or adjusted under 35 U.S.C. 154(b) by 0 days.

(21) Appl. No.: 09/545,570

(22) Filed: Apr. 7, 2000

Related U.S. Application Data (60) Provisional application No. 60/128,332, filed on Apr. 8, 1999.

(51) Int. Cl.[7] .................................................. H01J 37/00
(52) U.S. Cl. .......................... 250/306; 250/307; 73/105
(58) Field of Search ................................ 250/306, 307; 73/105

(56) References Cited

U.S. PATENT DOCUMENTS

| | | |
|---|---|---|
| 5,224,376 A | 7/1993 | Elings et al. |
| 5,440,121 A | 8/1995 | Yasutake et al. |
| 5,477,732 A | 12/1995 | Yasue et al. |
| 5,507,179 A | 4/1996 | Gamble et al. |
| 5,519,212 A | 5/1996 | Elings et al. |
| 5,681,987 A | 10/1997 | Gamble |
| 5,714,756 A | 2/1998 | Park et al. |
| 5,719,324 A | 2/1998 | Thundat et al. |
| 5,806,978 A | 9/1998 | Abraham et al. |
| 5,847,383 A | 12/1998 | Tong et al. |
| 5,907,096 A | 5/1999 | Chen |
| 5,918,274 A | 6/1999 | Chen et al. |
| 6,145,374 A | * 11/2000 | Niechonski et al. ........... 73/105 |

FOREIGN PATENT DOCUMENTS

EP    0 684 595 A1    11/1995

OTHER PUBLICATIONS

EPO Abstract of JP 06 147882 A (Ricoh Co. Ltd.), May 27, 1994.
EPO Abstract of JP 08 129018 A (Nissin Electric Co., Ltd.), May 21, 1996.
EPO Abstract of JP 09 269330 A (Olympus Optical Co., Ltd.), Oct 14, 1997.
EPO Abstract of JP 06 323843 A (Seiko Inst. Inc.), Nov. 25, 1994.
EPO Abstract of JP 11 030620 A (Seiko Inst. Inc.), Feb. 2, 1999.
Dror Sarid, Scanning Force Microscopy, 1994, pp. 10–11, Revised Edition, Oxford University Press, Oxford, UK.
A.E.H. Love—*A Treatise on the Mathematical Theory of Elasticity*—1927 —pp. 428–431—Fourth Edition—Dover Publications—New York—USA.

* cited by examiner

*Primary Examiner*—Kiet T. Nguyen
(74) *Attorney, Agent, or Firm*—Patent Law Offices of Heath W. Hoglund (57) ABSTRACT

An apparatus and method for determining a force of interaction between a sample and a tip on a cantilever. The method uses a non-Hookian equation to model the cantilever as it is deflected by the force of interaction between the sample and the cantilever tip. The sample is positioned at a predetermined distance from the cantilever tip such that the cantilever is deflected by the force of interaction. The positions of a plurality of points on the cantilever are then rapidly measured and the force of interaction from the measured positions is then obtained using a non-Hookian model that accounts for higher order vibrational modes of the cantilever.

12 Claims, 3 Drawing Sheets

SCANNING FORCE MICROSCOPE TO DETERMINE INTERACTION FORCES WITH HIGH-FREQUENCY CANTILEVER

The present application relies on the benefit of priority of U.S. provisional patent application Serial No. 60/128,332, filed on Apr. 8, 1999.

BACKGROUND OF THE INVENTION

1. Field of the Invention

The present invention relates to a scanning force microscope used for studying surface properties of materials on size scales ranging from the angstrom to the micron level.

2. Description of Related Art

Scanning force microscopes (SFM), also referred to as atomic force microscopes (AFM), are known for their use in a broad range of fields where high resolution information regarding the surface region of a sample is desired. Some types of SFMs utilize a small probe comprising a tip attached to the free end of a flexible cantilever for probing the surface of a sample. The tip of the probe is sharp and may either contact the sample or sense the sample without direct contact. The position of the tip is normally determined in all modes of operation of the machine. This position is usually obtained by measuring the angular deflection of the cantilever to which the tip is attached. The cantilever tip assembly is conventionally modeled as a mechanical simple harmonic oscillator (SHO) having an effective mass and effective spring constant.

The length of the cantilever is generally less than 300 $\mu$m. Forces between the tip of the probe and the sample surface cause the cantilever to deflect (i.e., bend), and a detector measures the cantilever deflection as the tip is scanned over the sample, or the sample is moved under the tip. The measured cantilever deflections can be used to generate constant force contours that are related to the surface topography. SFMs can be used to study solids, liquids, insulators, semiconductors or electrical conductors.

In addition to imaging, SFMs are used to measure forces of interaction between the probe tip and the surface. This is accomplished by performing a force-distance measurement. Conventional SFMs measure the position of the tip and the position of the sample. The value of a single spring constant associated with the elastic properties of the cantilever is determined experimentally. In a static calibration, the deflection caused by known loads applied to the cantilever is measured, and the constant is obtained from the deflection. In a dynamic calibration, the shift in the lowest resonance frequency of the cantilever is measured for different mass loads, and the constant is derived from that frequency shift. The spring constant is then used to convert cantilever deflections into forces.

The forces that contribute to the deflection of the SFM cantilever can be divided into two categories: repulsive and attractive. The repulsive force that typically dominates at very short range (tip-to-sample separation <0.3 nm) is the strong core repulsive force. At larger separations, the tip-to-sample force arises from a number of physical phenomena such as electrostatics, magneto-statics and surface tension. One important long range force that affects all SFMs is the electrostatic force commonly referred to as the Van Der Waals force. The variation of the total force, including the Van Der Waals force, upon the distance between the tip and the sample depends on whether the distance is within the contact region or the non-contact region. In the contact region, the cantilever is held less than a few tenths of a nano-meter from the sample surface, and the total inter-atomic force between the cantilever and the sample is repulsive. In the non-contact region, the cantilever is held on the order of one to ten nano-meters from the sample surface, and the inter-atomic force between the cantilever and the sample can be either attractive or repulsive. The significance of these two forces can be illustrated with some examples. The repulsive force is responsible for keeping individual elements of systems dispersed, such as keeping red blood cells separate and preventing coagulating of the blood in blood vessels. The attractive force is responsible, for example, for the attachment of drugs to the proper receptors, so that the drugs can have effect.

When used as imaging tools, SFMs operate in one of two modes: variable tip position or constant tip position. In the variable tip position mode, forces between tip and sample are allowed to alter the Z-axis position of the tip. The point at which the tip probes the sample surface is raster scanned (the tip and sample surface move with respect to one another in an X-Y plane) while the position of the tip (along the Z direction) is recorded. In this manner, a series of positional data point sets (x,y,z) are obtained. In the constant tip position mode, the Z position of the tip is maintained fixed during the raster scan, by applying forces to the cantilever through a piezoelectric actuator. In this mode, the Z portion of the positional data point (x,y,z) is obtained by measuring the piezoelectric voltage necessary to maintain a constant separation.

Cantilever based SFMs utilize three distinct sub-modes of operation which can be performed in either the constant tip position mode or the variable tip position mode. These sub-modes are contact, intermittent contact, and non-contact. In contact-SFM, also known as repulsive-SFM, the probe tip makes physical contact with the sample (i.e., the tip is brought close enough to the sample surface so that the dominant repulsive force is the strong core force). The tip is attached to the free end of a cantilever having a spring constant lower than the effective spring constant holding the atoms of the sample together. As the scanner gently traces the tip across the sample (or the sample moves under the tip), the contact force causes the cantilever to bend to accommodate changes in sample topography. The Z position of the cantilever is typically measured using optical techniques. The most common method involves the use of an optic lever, consisting of a laser beam reflected by the surface of the cantilever onto a position-sensitive photo-detector (PSPD). As the cantilever bends, the position of the laser beam on the detector shifts, indicating the bending of the beam, which is approximately equal to the change in the Z-displacement of the free end of the cantilever. Other methods to detect the cantilever deflection are known, and include optical interference, a tunneling microscope, the use of a cantilever fabricated from a piezo-electric material, or a magnetic pickup system.

An SFM can also be operated in a mode where the tip is not in direct contact with the sample surface (i.e., where the dominant force is not the strong core repulsion). The simplest non-contact mode of operation places the tip far enough above the surface so that the structural stiffness of the cantilever at the equilibrium position is sufficient to counter the sum of all attractive forces. The tip-to-sample separation (usually a few nano-meters) must be small enough so that the force field generated by the sample is sufficient to measurably deflect the cantilever. The sample is then moved towards the tip, and the tip displacement is recorded as in the variable contact mode technique. This is the only conventional non-contact mode to work in fluid, but it is difficult to implement.

Another non-contact technique involves oscillating the cantilever near its resonant frequency. The tip-to-sample distance is then reduced until the existence of tip-to-sample forces causes a shift in the resonant frequency of the cantilever. Either the amplitude of vibration at the original resonant frequency is measured or the shift in phase between the driving signal and the cantilever oscillation is measured. A major shortcoming of the oscillating non-contact mode is that it provides lower lateral resolution than the contact mode. Generally, lateral resolution around 10 nano-meters is obtained.

Non-contact SFM is desirable because it provides a means for measuring sample topography with no contact between the tip and the sample and thus causes minimal damage to the sample. It is desirable to have the highest possible resonant frequency so that physically meaningful averages can be taken at reasonable raster scanning rates. Typically, cantilevers with spring constants around 100 N/m having resonant frequencies in the range of 300–600 kHz are utilized. The total force between the tip and the sample in the non-contact region is typically very low, generally about $10^{-12}$ N. This low force is advantageous for studying soft or elastic samples as well as non-covalently bound adsorbates on surfaces. A further advantage is that samples like silicon wafers are not contaminated through contact with the tip, conferring an advantage in the microelectronics industry.

Intermittent contact mode is a hybrid of the contact and non-contact modes. In this mode, the cantilever is also made to oscillate near its resonant frequency. The amplitude of oscillation is typically tens to hundreds of nano-meters. A tip-sample separation is chosen so that, at the bottom of its stroke, the probe tip comes into direct contact with the sample surface. Current literature does not describe in detail how the physical interaction between the tip and sample generates the signal measured in intermittent contact mode. In general, it can be said that some combination of the long range force of interaction, the adhesive force, and the strong core repulsion experienced at the bottom of each stroke alters the vibrational amplitude of the cantilever. When operated in air, intermittent contact mode is usually performed with a stiff cantilever like that used in non-contact mode. A benefit of intermittent contact mode is that it reduces lateral dragging of the sample, as compared with contact mode. When scanning in a fluid, lower resonant frequency cantilevers are used (10–100 kHz) to prevent viscous damping forces from extinguishing the signal. An advantage of intermittent contact mode is that it routinely provides very high lateral resolution (almost as high as contact mode) but does not present high shear forces in the X-Y plane. This permits imaging of delicate samples that are easily pushed around by the tip.

In conventional devices, the cantilever-tip assembly is interpreted as a mechanical simple harmonic oscillator (SHO) that cannot vibrate at more than one frequency. In reality, multiple vibrational frequencies are excited during normal SFM operation, and many frequencies exist simultaneously in the system. The linear equation $F=-kz$ (where F is the force, k the spring constant, and z the tip's deflection measured from its equilibrium position) given by Hooke's Law for an SHO, does not allow modeling of an oscillator resonating at more than one frequency. As the cantilever approaches the snap-to-contact point (the tip-sample separation where the attractive force gradient exceeds the effective spring constant obtained using the SHO model), the SHO model gives incorrect results. This is because as the cantilever approaches the sample beyond the snap-to-contact point, the cantilever moves fast and cannot oscillate only in its lowest frequency mode. The SHO model thus is not useful in evaluating measurements at and beyond the snap-to-contact point.

The snap to contact point is the point where a large and rapid increase in the attractive force occurs. This increase is analogous to the increase in attractive force experienced when two magnets of opposite polarity are approached. The attractive force gradually increases, up to a point where a further small movement greatly increases the force, and it becomes difficult to keep the poles from contacting.

Conventional devices in which the cantilever is considered to be a simple harmonic oscillator (SHO) also limit the speed with which data can be meaningfully collected. These systems use Hooke's Law, where the expression $F=-kz$ is used to convert cantilever displacement measurements to tip-sample force values. In these devices, the value of k is assumed to be known, the cantilever vertical deflection z is measured, and thus the force F can be computed. As indicated above, this method is only useful for measurements taken at frequencies lower than the lowest resonant mode of the cantilever. This means that high-speed topographs as well as force-distance measurements taken at high speed are not well modeled using conventional systems.

Static, 3-dimensional measurements of topographic surfaces of materials, such as carbon fiber/polymer composites and semiconductors, can be made using the SHO methods. However, rapid topographical measurements, force-volume images, or real time measurements of interactions of molecules necessary to study biological systems cannot be done reliably using an SHO model, because they require very rapid measurements.

Another problem with conventional devices is that the speed at which the cantilever approaches the sample must be slow enough so that the cantilever does not vibrate above its first mode. If the speed of motion of the cantilever is above a certain value, then vibrations will be induced in the cantilever, and the measurements of the force will give inaccurate readings of the tip-to-sample distance (d). Conventional methods can provide only one data point (tip-to-sample distance) each millisecond, and thus cannot scan a surface topography of an area fast enough for real-time imaging of a biological living sample, such as a protein, which can move many pixels in one second and change the topography of the area during the scan. To have chemical specificity while resolving the motion of such a biological living sample, meaning that the chemical composition of the sample can be determined, one needs to get force-distance measurements at each pixel consisting of several measurements at each location on the X-Y plane. Thus, even for a modestly sized 64×64×64 points image, the frequency of the cantilever must be larger than $10^5$ voxels/sec. Under those conditions, vibrational modes having frequencies larger than the lowest natural frequency of the cantilever will be excited.

In light of the foregoing, there is a need in the art for an improved SFM.

SUMMARY OF THE INVENTION

Accordingly, the present invention is directed to a method and device that substantially obviate one or more limitations of the related art. To achieve these and other advantages, and in accordance with the purposes of the invention, as embodied and broadly described herein, the invention involves a method for determining a force of interaction between a sample and a tip on a cantilever. The method includes positioning the sample and the cantilever tip a predetermined distance from each other, rapidly measuring respective positions of a plurality of points on the cantilever as the cantilever is deflected by the force of interaction, modeling the cantilever with a non-Hookian model that accounts for higher order vibrational modes of the cantilever, and calculating the force of interaction from the measured positions of the plurality of points using the model.

Another aspect of the invention includes a method for determining a force-distance curve for an interaction between a tip on a cantilever and a sample. The force-distance curve is determined by positioning the sample and the cantilever tip a predetermined distance from each other, rapidly measuring the respective positions of a plurality of points on the cantilever as the cantilever is deflected by the force of interaction, modeling the interaction with a non-Hookian model that accounts for higher order vibrational modes of the cantilever for the predetermined distance, calculating the force of interaction from the measured positions of the plurality of points using the model thus determining one point of the force-distance curve, varying the predetermined distance by a preselected distance increment, and repeating the rapidly measuring, the modeling, the calculating, and the varying of a preselected number of times until the force-distance curve is determined.

In yet another aspect, the invention includes an apparatus for determining a force of interaction between a sample and a tip on a cantilever. The apparatus comprises a positioning mechanism to position the tip at a known location in relation to the sample, a deflection measurer for determining rapidly the deflection due to the force of interaction of a plurality of points on the cantilever, a processor for modeling the cantilever with a non-Hookian model accounting for higher order vibrational modes of the cantilever, and for calculating the force of interaction from the measured deflection of the plurality of points using the model of the cantilever, a memory for storing instructions for the processor to model the cantilever, and a controller for directing the positioning mechanism to position the tip at predetermined locations.

The present invention preferably obtains accurate force measurements using an SFM at high speed. This invention allows the distance between the cantilever tip and the sample to be changed rapidly at an exact point (or "pixel") that is being probed over the sample, and also allows rapid movement of the tip across the sample, in a "raster-scanning" movement to analyze the entire surface of the sample. There are two specific situations in which this accuracy at high speed is desired. First, when the tip-to-sample separation is very small (within the snap-to-contact region). Second, when high data collection rates are desired for high-speed imaging and/or high speed force-distance measurements, as required when analyzing chemical or biological systems.

These accurate high speed force measurements are accomplished by a system utilizing a non-linear equation to model the resonant frequencies of the cantilever used to measure the tip-to-sample interaction. This system interprets accurately the higher order resonance modes of the cantilever that are excited in high speed applications. The method of the present invention does not necessarily require exact knowledge of the shape of the cantilever in order to obtain measured forces. Thus, it can be applied to existing SFM technology.

More specifically, the present invention allows for a direct spatial analysis of the data retrieved from scanning force microscopes working at high frequencies. Instead of determining the force of interaction between the cantilever tip and the sample by measuring the deflection of one location on the cantilever over time, the system of this invention measures cantilever deflection for a snapshot in time, at different locations on the cantilever. These rapid measurements of the deflection at multiple points are used in the model to obtain the force of interaction at a specific distance and location of the tip over the sample. The measurements are taken rapidly so that the cantilever does not substantially move between measurements of successive points.

For example, a modulated laser beam can measure the deflection of several points on the cantilever rapidly. Alternatively, more than one laser beam may be used, one measuring the deflection of each different point. Other suitable known methods for rapidly measuring the deflection of the cantilever at several locations can be used.

The force of interaction between the cantilever tip and the sample is thus determined according to the invention by applying a non-Hookian equation to data describing the deflection of points of the cantilever at one instant in time. In a preferred embodiment, the sample is moved toward and away from the cantilever, and the force computation according to the invention is repeated at several known distances between the sample and the cantilever. A force-separation curve can then be constructed, describing how the force of interaction changes as the tip is moved toward/away from the sample, over a specific X-Y location of the sample.

The force-separation curve is expected to have a characteristic shape for specific chemical elements. If the curve is compared to a library of curves from known elements and chemical compounds, the composition of the sample at the point being analyzed could be determined to obtain information about the distribution of elements within the sample on a molecular scale. However, at the present time a quantitative cataloguing of curves has not been developed, and the measurements could only be evaluated qualitatively.

In another embodiment according to the invention, the entire sample may be raster-scanned by the tip of the cantilever, so that force-distance curves can be constructed at successive locations over the sample, to produce an image of the entire sample that includes the sample's chemical composition. The raster-scan can be repeated to produce successive images showing the development over time of the sample, if the scanning is performed fast enough.

These applications are possible due to the ability of the system according to the present invention to interpret the higher oscillation modes of the cantilever that are excited when the cantilever is moved very rapidly toward the sample, and is moved from one position to the next on the sample at high speed. The system according to the present invention preferably only requires measurements of cantilever deflection at one instant in time at each distance between the sample and the cantilever. In the preferred embodiment, the force-separation curve can be generated more rapidly in this manner than is possible in systems requiring several measurements in time for each discrete distance.

Information regarding dynamic systems, such as cells and other biological samples, can also be determined by the system of the invention, before the sample has time to change. The ability of the system to interpret the higher vibrational modes of the cantilever that are excited during fast operation permits completing a raster scan of the entire sample before the sample changes substantially.

Besides the arrangements set forth below, the invention could include a number of other arrangements, such as those explained hereinafter. It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 3:
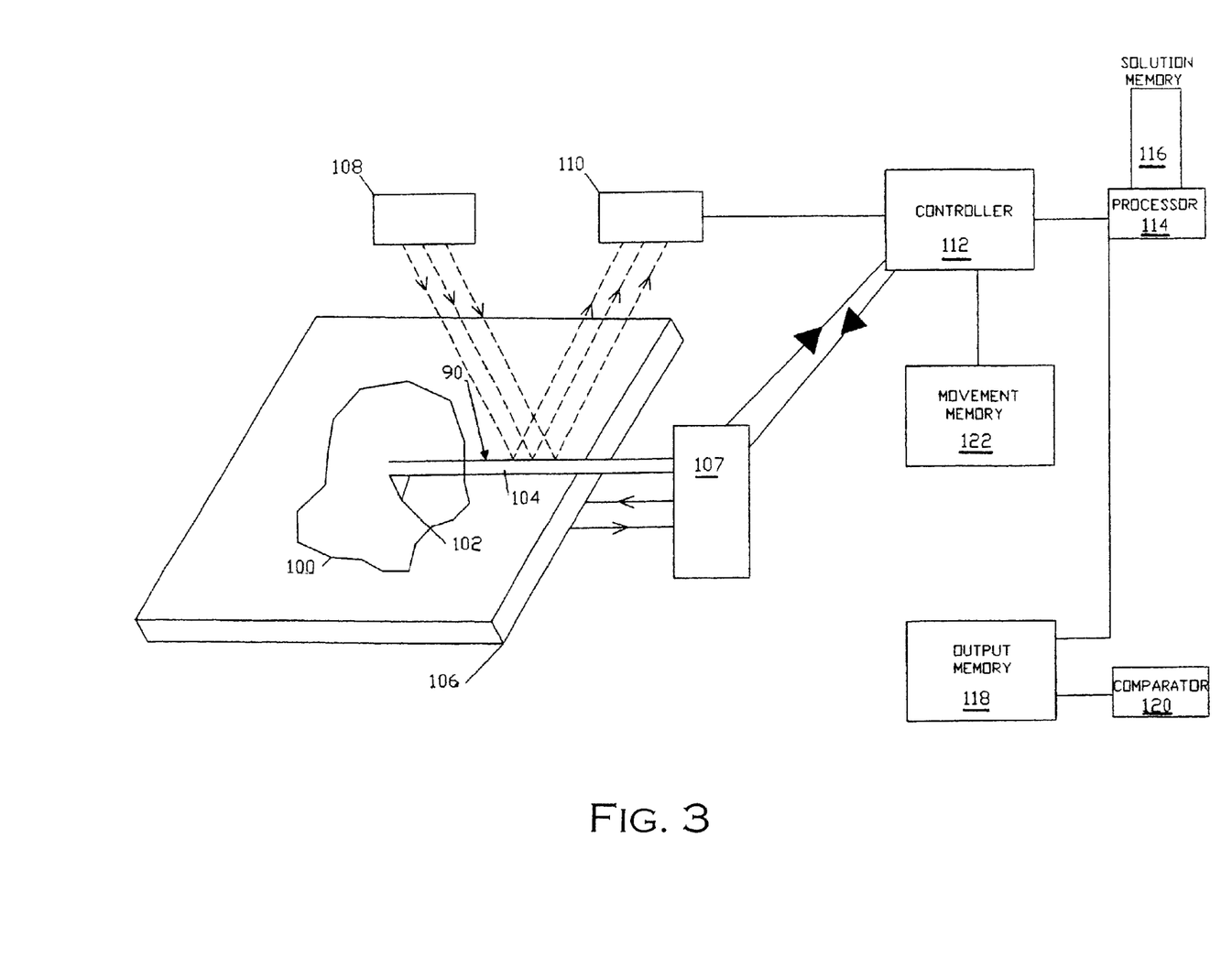
FIG. 3 is a schematic diagram of a scanning force microscope according to an embodiment of the invention.

A preferred embodiment of the system according to the invention will now be described with reference to FIG. 3. A sample (100) to be examined is placed on a sample holder on the scanning force microscope. A probe (90) including a cantilever (104) with a tip (102) is used to scan the sample. Any suitable combination of known cantilever and tip can be utilized. The cantilever (104) is connected to a base with a piezoelectric actuator (107), used to oscillate the cantilever (104). A positioning mechanism (106) is configured to move the sample (100) with three degrees of freedom (i.e., x, y, z). The positioning mechanism (106) could include, for example, motor driven gears or electro mechanical actuators that move the sample (100) away from and toward the probe (90) along the Z axis, as well as sideways in the X-Y plane. Alternatively, the probe (90) can be moved with respect to the sample (100). In a preferred embodiment, positioning mechanism (106) is located in the base of the machine, below the sample (100), to minimize the effect of vibrations on probe (90). Positioning mechanism (106) preferably also generates a signal reporting the (x, y, z) position of the probe (90) relative to sample (100).

One exemplary embodiment of the positioning mechanism (106) can include a coarse adjustment and a fine adjustment. Both adjustments can vary the x, y, z position of the tip relative to the sample. The coarse positioning system preferably includes mechanical elements, such as finely threaded screw drives, inchworms, stepper motors or micrometers, and has a range of motion typically around 100 $\mu$m to 10 mm. The fine positioning system preferably includes an octupole piezo tube, and has a range of movement between about 0.01 nm to 100 $\mu$m.

Figure 1:
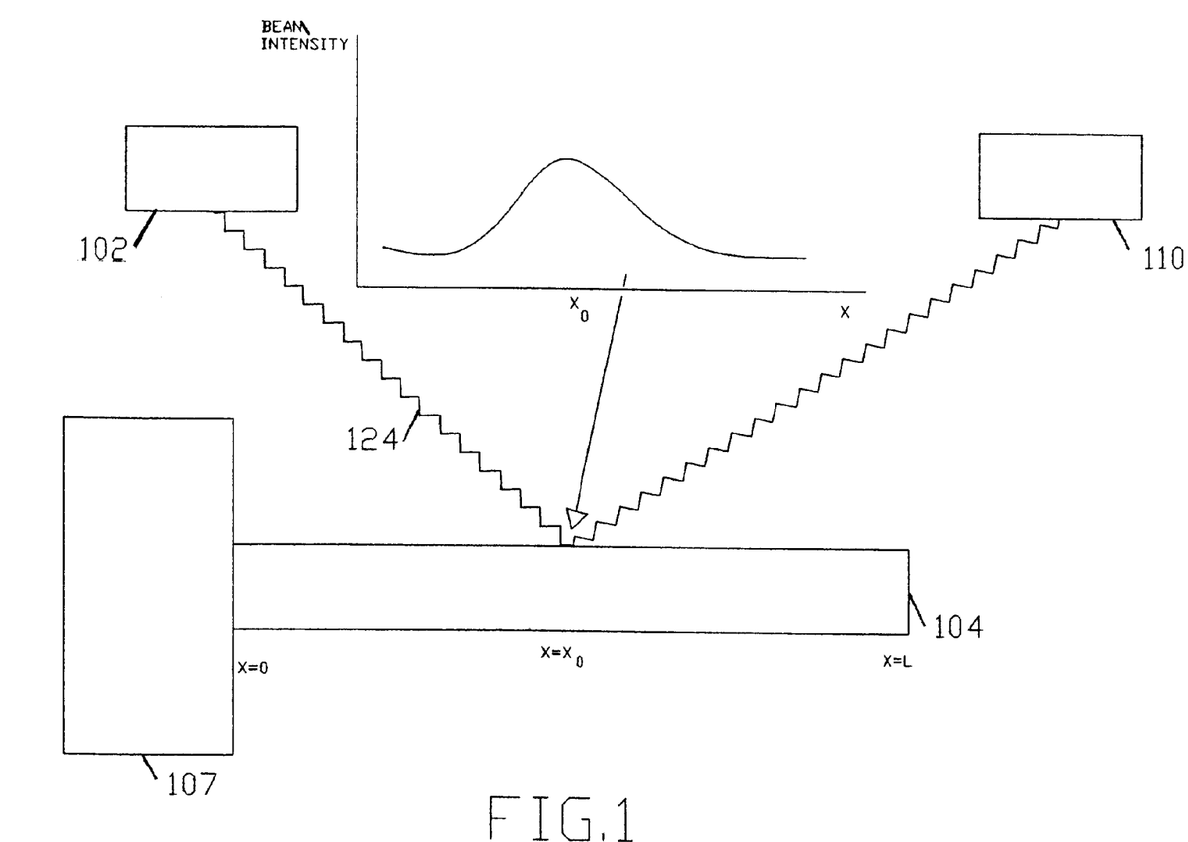
FIG. 1 is a schematic diagram showing a cantilever and a laser beam to measure the deflection of the cantilever.

In a preferred embodiment, a laser (108) is used to locate several points on cantilever (104). Knowing the position of an increased number of points on cantilever (104) improves the solution, but also increases the cost of the apparatus. The measurement of the position of all the particular points on the cantilever (104) can be performed in several ways by using a light sensor (110). In one embodiment, shown in FIG. 1, the laser (108) is a modulated source resulting in a single beam (124) which is reflected by the cantilever (104) and is then received by a single light sensor (110). This reflected modulated beam measures the position of multiple points on the cantilever (104), one point at a time, by moving to successive points with a frequency equal to the modulation frequency. Alternatively, as shown in FIG. 3, several simultaneous laser beams in a parallel array can be used to each measure the deflection of the cantilever (104) at one point only after being received by a respective element of an array of sensors (110).

The position information for all the points measured by sensor (110) is sent to controller (112) to indicate that the measurement has been completed, and to processor (114). Processor (114) is preferably a digital computer, having instructions to model the cantilever (104) as a beam vibrating with multiple modes of oscillation. The processor (114) uses position information from sensor (110) describing the deflection of cantilever points, to determine the magnitude of the force of interaction.

A solution memory (116) may be used to store the instructions for the processor (114). These instructions control how processor (114) interprets the interaction between sample (100) and the probe (90), and computes the force of interaction from the position data. The instructions may be stored in read only memory, in volatile memory, or any other known information storage system. Details of the solution steps recorded in solution memory (116) are given below.

The computed force of interaction is stored in an output memory (118). This force is computed for a specific distance between the probe (90) and the sample (100), and for a specific location of the tip (102) on the X-Y plane, from the positioning mechanism (106) along the length and width of sample (100). The output memory (118) receives information about the location of the probe (90), sample (100), and tip (102).

When the measurements for the force computation for one distance are completed, controller (112) instructs positioning mechanism (106) to change the distance between the probe (104) and the sample (100). The measurement is repeated at the new distance, and for other distances sufficient to generate a curve of force of interaction versus distance, also stored in output memory (118). The actual force computation can be performed after data for all or some of the points is measured, or could be performed in real time as the measurements are made if sufficient computing power is available. Depending on the type of interaction being investigated, the distance between the tip and the sample can be varied in increment sizes ranging from several Angstroms to several nano-meters at a time. In a further preferred embodiment, a comparator (120) could be used to match the computed force-distance curve to a catalog of known curves, each corresponding to a different chemical compound. Such catalog could be developed once sufficient expertise in these measurements is obtained. In this manner the composition of sample (100) at the point being analyzed could be determined.

A movement memory (122) may be used to store predefined distances at which the computation is to be carried out. Controller (112) instructs positioning mechanism (106) to move the sample (100) relative to the probe (90) to those distances. In addition, movement memory (122) may also contain instructions regarding the points on the surface of sample (100) that need to be sampled. Controller (112) then uses those instructions to command relocation of the sample (90) or cantilever tip (102) to the proper points.

Both the chemical composition and the shape of the sample (100) can be derived from the information measured by the cantilever tip (102). Each chemical environment exhibits a specific force-distance curve, that can be recognized once a catalogue of curves for known elements is developed. The shape of the sample (100) can be derived from one point of the curve alone, but for many (x, y) positions above the sample (100), by determining the position of the tip (102) giving a constant force of interaction as the tip (102) is moved over the sample (100) (this is called an isoforce contour). When the force is kept constant, the movement of the laser beam, indicating the position of the tip (102), is a direct measurement of the shape of the sample surface in regions of constant chemical composition.

The equations that are used by processor (114) to interpret the interaction of cantilever (104) with sample (100), according to the invention, are derived and described below.

Dynamics of the Cantilever

Cantilever dynamics have been studied in the past, however the present invention includes a solution better adapted to the new generation of SFMs. In particular the problem of high frequency response is addressed, and at the same time, the solution includes explicitly the tip-sample interaction force. Such a solution has only been partially addressed in the past.

We assume the cantilever to be a beam governed by the following equation:

$$\frac{\partial^2}{\partial x^2}\left(EI\frac{\partial^2 u}{\partial x^2}\right)+\rho A\frac{\partial^2 u}{\partial t^2}=0 \quad \text{Equation 1}$$

where u(x,t) is the deflection of the cantilever with respect to the horizontal at position x along the cantilever and at time t. E is the Young Modulus, I the (area) moment of inertia through the middle axis perpendicular to the plane of motion, ρ is the density of the cantilever and A the cross-sectional area of the cantilever.

To simplify, we consider the cross sectional area to be a constant. In that case, the parameters do not vary with x. Thus, we can define $$V^2 \equiv \frac{EI}{\rho A^2} \quad \text{Equation 2}$$

now we can rewrite Equation 1 as $$AV^2\frac{\partial^4 u}{\partial x^4}+\frac{\partial^2 u}{\partial t^2}=0 \quad \text{Equation 3}$$

In order to solve Equation 3, we need to set appropriate boundary conditions (BC). These conditions will also introduce the tip-sample interaction force that is to be measured. At the fixed end of the cantilever (x=0) we impose a no deflection condition.

$$u(x=0,t)\equiv 0 \quad \text{Equation 3a}$$

At the same point, since the lever is not free to rotate about that point, the condition is:

$$\frac{\partial u}{\partial x}(x=0,t)\equiv 0 \quad \text{Equation 3b}$$

At the free end, x=L, the cantilever experiences no torque if vertical interaction forces are considered, and the boundary condition is:

$$\frac{\partial^2 u}{\partial x^2}(x=L,t)\equiv 0 \quad \text{Equation 3c}$$

Finally, at the free end, the internal force on that layer of cantilever must equal the external force, so that the boundary condition is:

$$-EI\frac{\partial^3}{\partial x^3}u(x=L,t)=F[u(x=L,t)] \quad \text{Equation 3d}$$

A. Static Solution

Typically, the scientific community has used a solution to the previous simple harmonic oscillation problem for which the interaction force F is slowly varying with time. This renders a quasi static solution corresponding to the patching of a series of solutions for which $F=F_s$, where $F_s$ is a constant force.

In this static case, Equation 3 reduces to $$\frac{\partial^4 u_s(x,t)}{\partial x^4}=0 \quad \text{Equation 4}$$

where the variable "u" has a subscript "s" to indicate static solution. This equation, in conjunction with the four BC's provides a unique solution, $$u_s(x)=\frac{(3F_sL)x^2-(F_s)x^3}{6EI} \quad \text{Equation 5}$$

If the SFM monitors the deflection of one point of the cantilever, for example at x=L (it can be easily extended to any point), then the measured deflection, $z_s$, would be described as follows:

$$z_s(t)=\frac{F_s(t)L^3}{3EI} \quad \text{Equation 6}$$

As the force varies slowly with time, so does the deflection. This time dependence is explicit in Equation 6, to stress that measurements are made in time steps. This solution corresponds to a one-degree-of-freedom, simple-harmonic-oscillator (SHO) approximation of the cantilever with spring constant $3EI/L^3$. As an approximation, it has several limitations. In particular, it will fail when the tip-sample interaction force does not vary slowly. Under those circumstances, it may be possible to excite several vibrational modes on the cantilever and, consequently, a one-degree of freedom model will not be enough to determine the state of the system. In the quasi static regime, on the other hand, one degree of freedom is enough because if z(t) is measured, Equations 5 and 6 can be used to compute the entire shape of the cantilever.

B. Generalizing the SHO Solution

In order for the SFM to be of use in fast imaging where a force-distance curve is preferably obtained for each pixel as quickly as possible, for example in the study of biomolecular motion to capture changing systems, the quasi-static solution must be revisited because it does not give good results.

With that in mind, we now generalize the previous problem by allowing for the cantilever to sense, not only a constant force, but also a gradient of the force-distance curve as the tip moves away or towards the surface. This will enrich the solution for the deflection u(x,t), by allowing the possibility of vibrations superimposed on the SHO solution. Therefore, we write the force as follows:

$$F=F_s+G[u(L,t)-u_s(L)] \quad \text{Equation 7}$$

In writing Equation 7, we assumed, as in the BC's, that the force on the cantilever is applied on the tip at x=L. Here $F_s$ is the average force the tip senses at one location above the sample, and G is the derivative of the force-distance curve at that same position.

We write the solution u(x,t) to Equation 3 as the sum of the static solution and a superposition of normal modes, $$u(x, t) = u_s(x) + \sum_n f_n(x)\cos(\omega_n t + \varphi_n) \qquad \text{Equation 8}$$

where $f_n(x)$ represents the shape of the normal modes, $\omega_n$ is the angular frequency corresponding to the mode $f_n(x)$, and $\phi_n$ is the phase angle of mode n.

Substituting Equation 8 into Equation 3 and noticing that $f_n(x)$ represents linearly independent terms, we obtain:

$$\frac{d^4 f_n(x)}{dx^4} - \frac{\omega_n^2}{AV^2 f_n} f_n(x) = 0 \qquad \text{Equation 9}$$

with solutions as follows:

$$f_n(x) = f_n^1 \cos kx + f_n^2 \sin kx + f_n^3 \cos kx + f_n^4 \sinh kx \qquad \text{Equation 10}$$

where $f_n^1, f_n^2, f_n^3, f_n^4$ are constants, and k indicates the wave number, equal to $2\pi$ divided by the wavelength. As derived from the prior art literature, $k^4 = \omega^2/AV_2$, where A is the cross sectional area and V is the speed of sound for the material. (See, e.g., Scanning Force Microscopy, by Dror Sarid, Revised Ed., 1994, pg. 10.)

As a next step, we apply the BC's of equations 3a, 3b, 3c, 3d and end up with the proper BC for each individual mode $f_n(x)$:

$$f_n^1 + f_n^3 = 0 \qquad \text{Equation 11}a$$

$$f_n^2 + f_n^4 = 0 \qquad \text{Equation 11}b$$

$$-f_n^1 \cos kL - f_n^2 \sin kL + f_n^3 \cos h\, kL + f_n^4 \sin h\, kL = 0 \qquad \text{Equation 11}c$$

$$k^3(-f_n^1 \sin kL - f_n^2 \cos kL - f_n^3 \sin h\, kL - f_n^4 \cos h\, kL) = \gamma(f_n^1 \cos kL + f_n^2 \sin kL + f_n^3 \cos h\, kL + f_n^4 \sin h\, kL) \qquad \text{Equation 11}b$$

where $\gamma = G/EI$.

In order for the system of Equations 11a–d not to have trivially null solutions, we must require that the determinant of the system be zero. Thus $$k^3(1+\cos kL \cdot \cos kL) = \gamma(\sin kL \cdot \cos h\, kL - \cos h\, kL \sin h\, kL) \qquad \text{Equation 12}$$

And with the definitions $\beta = \gamma L^3$ and $\xi_n = k_n L$, one obtains a transcendental equation for the frequencies $\omega_n$ for a given G $$\frac{1 + \cos\xi_n \cdot \cosh\xi_n}{\sin\xi_n \cdot \cosh\xi_n - \cos\xi_n \cdot \sinh\xi_n}\xi_n^3 = \beta \qquad \text{Equation 13}$$

We can use these frequencies to find, for each n, the normal modes $f_n^i$ (I=1,2,3,4) (in fact we will obtain 3 ratios between the $f_n^i$ since the system is, by construction, indeterminate). After performing some algebraic steps, one obtains the following:

$$\frac{f_n^1}{f_n^4} = -\frac{\xi_n^3}{\beta}\frac{\cos\xi_n + \cosh\xi_n + \sinh\xi_n - \sin\xi_n}{\cos\xi_n - \cosh\xi_n + \sin\xi_n - \sin\xi_n} \equiv R_n \qquad \text{Equation 14a}$$

$$\frac{f_n^2}{f_n^4} = -1 \qquad \text{Equation 14b}$$

$$\frac{f_n^3}{f_n^4} = -\frac{\xi_n^3}{\beta}\frac{\cos\xi_n + \cosh\xi_n + \sinh\xi_n - \sin\xi_n}{\cos\xi_n - \cosh\xi_n + \sin\xi_n - \sinh\xi_n} = -R_n \qquad \text{Equation 14c}$$

Finally, by using Equation 8 one arrives at the complete solution to the problem $$u(x, t) = u_s(x) + \qquad \text{Equation 15}$$

$$\sum_n f_n^4 \left[ R_n \cos\left(\frac{\xi}{L}x\right) - \sin\left(\frac{\xi}{L}x\right) - R_n \cosh\left(\frac{\xi}{L}x\right) + \sinh\left(\frac{\xi}{L}x\right) \right]$$

$$\cos(\omega_n t + \varphi_n)$$

In the next section, an expression for the signal that is actually measured by the laser beam reflected from the cantilever is derived. That signal is a consequence of the motion u(x,t), but does not indicate the motion directly.

The SFM Signal

In optical detection, the intensity of a light beam reflected from the top of the cantilever is measured by a photo detector system. If the beam has a distribution of intensities, each of those intensities contributes to the total signal.

The optical detection system, in a preferred embodiment according to the invention, includes two photo diodes that collect the light of the laser beam. The spot of laser light has an elliptical shape, and when in equilibrium, the top of the ellipse impinges on the top diode, while the bottom of the ellipse impinges on the bottom diode. In that condition, both diodes produce the same voltage. When the cantilever moves, the reflected laser light is deflected, and one of the photo diodes receives more light, and produces a greater voltage. In this manner the difference in voltage is proportional to the z coordinate of the point being considered.

The signal originated at position x on the cantilever is thus proportional to the deflection u(x,t) and to the light intensity at that point. If u(x,t) is zero, there would not be any signal because the two photo diodes would be balanced and, if, the intensity were zero, then the signal would also be zero, since there would be no light to measure. Therefore, neglecting instrument constants, the signal at the photo diode is $$S(t) = \int_0^L u(x, t) \cdot g(x) dx \qquad \text{Equation 16}$$

where g(x) is the light-beam intensity profile. We assume it has a gaussian shape:

$$g(x) = \frac{1}{\sigma\sqrt{\pi}} e^{-\left(\frac{x-x_a}{\sigma}\right)^2} \qquad \text{Equation 17}$$

In these equations, $\sigma$ represents the width of the laser beam, $X_a$ represents the central position of that beam, and $X_0$ is the initial position at time t=0. By using Equations 14, 15, 17, and 5, the integral in Equation 16 can be carried out explicitly. The result is $$S(t) = S_{static} + \sum_n f_n^4 \left[ R_n e^{-\left(\frac{k\sigma}{2}\right)^2} \cos kx_o - R_n e^{\left(\frac{k\sigma}{2}\right)^2} \cosh kx_o - \right. \qquad \text{Equation 18}$$

$$\left. e^{-\left(\frac{k\sigma}{2}\right)^2} \sin kx_o + e^{\left(\frac{k\sigma}{2}\right)^2} \sinh kx_o \right] \cos(\omega_n t + \varphi_n)$$

where $S_{static}$ is the following constant $$S_{static} = \frac{F_s}{3EI} \cdot \left[(3L - x_o)x_o^2 + \frac{3}{2}\sigma^2(L - x_o)\right] \quad \text{Equation 19}$$

The constants $f_n^4$ can be obtained from initial conditions.
Further Generalization to the SHO Solution Although the assumption in Equation 7 for the force is a generalization over what is commonly used, it is natural to ask whether the problem could be solved for an arbitrary force shape. In this section, we present a way in which such a solution is obtained. Regrettably, no closed form solution can be obtained for the general case. However, by writing an algorithm following these steps, it will be easy to write a computer code to obtain numerical solutions to the general case.

Figure 2:
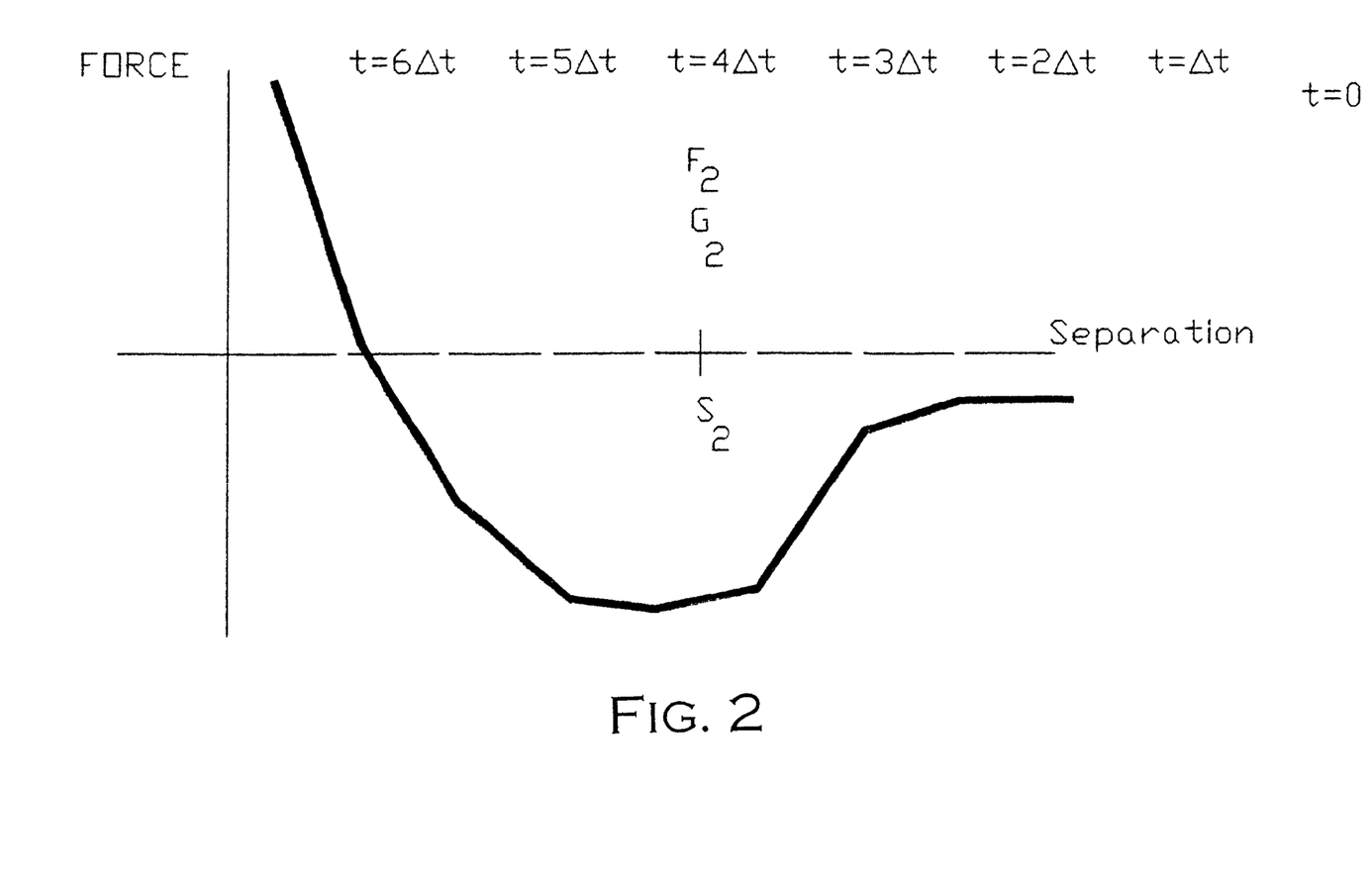
FIG. 2 is a graph of the computed force as a function of tip-to-sample separation.

In FIG. 2, a real Force-separation is shown to be made up by the concatenation of 8 linear segments. Each segment is characterized by a tip-sample separation, an average force and a slope. These parameters, for each segment, are measured at a constant distance between the probe tip and the sample. For example, segment 2 is characterized by $s_2$, $F_2$, and $G_2$. For that same segment, the tip does not move during the period of time from $t=2\Delta t$ to $t=3\Delta t$. In general we shall consider M intervals labeled "m", that is $m=0,1,2,3,\ldots,M-1, M$. For negative values of m (and time) we assume that the force is zero (far away region) and the cantilever is in its horizontal equilibrium position. In this position, the photo detector is set to output zero volts.

Experimental measurements provide S(t) at thousands of points, so it is desired to account for situations where the number of data points is larger than M. S(t) is the signal at the detector. Let us then divide each of the above-mentioned segments into P smaller segments. Each of those smaller segments will comprise a time-interval $\delta t$, so that $\Delta t=P\delta t$. There shall be a total number of points $D=PM$. We choose P so that D is the number of data points.

The signal S(t) in Equation 18 depends on the light-beam width $\sigma$ and the point $x_o$ at which the light-beam touches the cantilever. Therefore, it is possible to collect many signals, $S_q(t)$ ($q=1,2,3,\ldots,Q$), rapidly, where q represents an index of successive possible laser beam widths, and Q is the total number of beam widths considered in the measurement. Each of those signals could consist of a measurement of S(t) for a given $\sigma$. In this way information on the deflection of a plurality of points on the cantilever can be obtained rapidly. In that case $\sigma$ can be written as $\sigma=\sigma_o+[q-(Q+1)/2]\Delta\sigma$. However, $\sigma 0$ is not the only parameter available. The position of the light-beam could also be changed to rapidly obtain the deflection at several locations. However, whatever one decides to choose, the following general derivation applies.

We choose Q to be equal to the number of frequencies the cantilever is assumed to support (it may be larger, but never smaller than that). This can be determined before the tip interacts with the surface. That is when the tip and the surface are far away. It is true that the frequency spectrum will change as the tip approaches the sample. However, the number of frequencies involved should not increase since the cantilever is driven more by inertia than by the tip-sample force. In a typical experiment, one could excite the tip with a broad source of frequency and study the cantilever's response. Alternatively, the thermal noise spectrum could be analyzed. If three frequencies were excited then one would choose Q=3. For safety one may want to take Q=4 and check if one gets null coefficients for modes above the third.

Equation 18 is now rewritten to simplify the analysis $$S_p^{qm} = S_{static}^{qm} + \sum_{n=1}^{n=Q} f_n^{4m}\psi_n^q \cos(\omega_n \cdot p \cdot \delta t + \varphi_n) \quad \text{Equation 20}$$

where $\psi_{nq}$ is shorthand for the expression in square parenthesis in Equation 18. The left-hand side of Equation 20 must be compared to the QPM=QD data points, since Q values of Sigma are taken over P time intervals and M force intervals. The right hand side can then be obtained by fitting this expression to experiments. In order to complete the process, one needs to choose M, the number of regions into which we want to divide the whole "separation" range. It seems that M=10 should be a good guess. By doing this fitting, we are solving an inverse problem. Namely, that of obtaining the force-separation curve from the measured signals.

The term $S_p^{qm}$ of Equation 20 is measured Q×P×M times. $S_{static}^{qm}$ is evaluated from Equation 19, with $F_s$ being unknown, and the right hand side of Equation 20 is evaluated using Equation 18, with $f_n^4$ being unknown. The result is a system of Q×P×M equations, from which the unknowns can be extracted.

CONCLUSIONS

The system according to the present invention preferably solves the problem of modeling the oscillations of the SFM cantilever especially at high frequencies. First, the SHO solution is generalized by modeling the cantilever as vibrating around the SHO solution. This generalization allows for the retrieval of the frequency spectrum at different tip-sample separations. Finally, the system shows how to analyze experimental results for a general case, where the force may be nonlinear, as is the case in practical applications. Under those circumstances, closed form solutions for the equation used in the system are usually not obtained, but a solution based on a numerical algorithm can easily be obtained.

In a preferred embodiment of the invention, a data acquisition system collects the deflection information for several points on the cantilever rapidly. The information is then transmitted to a controller, which preferably includes memory means for storing the deflection information, and a processor for executing the steps of the solution on the deflection information according to the system of the invention. A series of commands can be also stored in another memory, such as a ROM, and can instruct the processor to perform the steps of the solution on the deflection information, according to the invention, to obtain the interaction forces between the sample and the tip. The system can further successively vary the distance between the sample and the tip, and repeat the interaction force computation at each different distance, to generate a force-separation curve.

A processor could be employed to correlate the force-separation curve with curves characteristic of certain chemicals, to determine the chemistry of the region, or pixel, being probed by the tip.

The force-separation curve derived by the processor can be output, or can be further processed to obtain visual or other representations of the topography or of the chemical identity of the sample being scanned.

Additionally, the system can include actuators for moving the tip of the cantilever across the surface of the sample, to raster-scan the sample under control of a scan controller. Force-separation information obtained at the several raster-scanned pixels could be stored in a further memory for display or processing.

The system according to the invention is especially well suited to determine forces between a sample and an SFM, but could also be used to process data from capacity force microscopes, magnetic microscopes, or other devices where a force is computed from vibrational and positional data.

It will be apparent to those skilled in the art that various modifications and variations can be made to the structure and methodology of the present invention without departing from the scope or spirit of the invention. In view of the foregoing, it is intended that the present invention cover modifications and variations of this invention provided they fall within the scope of the following claims and their equivalents.

What is claimed is:

1. A method for determining a force of interaction between a sample and a tip on a cantilever, comprising:

positioning the sample and the cantilever tip in a predetermined distance from each other;

rapidly measuring respective positions of a plurality of points on the cantilever as the cantilever is deflected by the force of interaction;

modeling the cantilever with a non-Hookian model that accounts for higher order vibrational modes of the cantilever; and calculating the force of interaction from the measured positions of the plurality of points using the model.

2. The method according to claim 1, further comprising:

moving the cantilever tip to a new position over the sample, and repeating the measuring, the modeling, and the calculating to determine the chemical composition of the sample at the new position; and repeating the moving to determine the chemical composition of the sample at a plurality of positions.

3. A method for determining a force-distance curve for an interaction between a tip on a cantilever and a sample, comprising:

positioning the sample and the cantilever tip in a predetermined distance from each other;

rapidly measuring the respective positions of a plurality of points on the cantilever as the cantilever is deflected by the force of interaction;

modeling the cantilever with a non-Hookian model that accounts for higher order vibrational modes of the cantilever for the predetermined distance;

calculating the force of interaction from the measured positions of the plurality of points using the model thus determining one point of the force-distance curve;

varying the predetermined distance by a preselected distance increment; and repeating the measuring, the modeling, the calculating, and the varying of a preselected number of times until the force-distance curve is determined.

4. The method according to claim 3, wherein the modeling and calculating are performed after each repeated measuring.

5. The method according to claim 3, further comprising:

comparing the determined force-distance curve with predetermined force-distance curves to determine a chemical composition of the sample.

6. The method according to claim 3, further comprising:

moving the cantilever tip to a new position over the sample, and repeating the measuring, the modeling, and the calculating to determine the chemical composition of the sample at the new position; and repeating the moving to determine the chemical composition of the sample at a plurality of positions.

7. The method according to claim 3, wherein the rapidly measuring includes modulating a laser beam reflecting on the cantilever.

8. An apparatus for determining a force of interaction between a sample and a tip on a cantilever, comprising:

a positioning mechanism to position the tip at a known location in relation to the sample;

a deflection measurer for determining rapidly deflection due to the force of interaction of a plurality of points on the cantilever;

a processor for modeling the cantilever with a non-Hookian model accounting for higher order vibrational modes of the cantilever, and for calculating the force of interaction from the measured deflection of the plurality of points using the model of the cantilever;

a memory for storing instructions for the processor to model the cantilever; and a controller for directing the positioning mechanism to position the tip at predetermined locations.

9. The apparatus according to claim 8, wherein the positioning mechanism moves the tip towards and away from the sample.

10. The apparatus according to claim 8, wherein the positioning mechanism moves the tip across the sample.

11. The apparatus according to claim 8, further comprising an output memory to store the force of interaction determined for the known location of the tip relative to the sample.

12. The apparatus according to claim 8, further comprising a position memory for storing desired locations of the tip relative to the sample to be achieved by the positioning mechanism.

* * * * *